(12) United States Patent
Chin et al.

(10) Patent No.: US 6,765,298 B2
(45) Date of Patent: Jul. 20, 2004

(54) SUBSTRATE PADS WITH REDUCED IMPEDANCE MISMATCH AND METHODS TO FABRICATE SUBSTRATE PADS

(75) Inventors: Tsun-kit Chin, San Jose, CA (US); William Landucci, San Jose, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 207 days.

(21) Appl. No.: 10/013,326

(22) Filed: Dec. 8, 2001

(65) Prior Publication Data

US 2003/0107056 A1 Jun. 12, 2003

(51) Int. Cl.[7] .................. H01L 23/48; H01L 27/10; H01L 23/12
(52) U.S. Cl. .................. 257/776; 257/211; 257/700; 257/758
(58) Field of Search .................. 257/207, 208, 257/211, 758, 775, 776, 781, 786, 690, 691, 692; 438/128, 129, 622, 639, 612, 614

(56) References Cited

U.S. PATENT DOCUMENTS

| | | | | |
|---|---|---|---|---|
| 5,736,791 A | * | 4/1998 | Fujiki et al. | 257/781 |
| 5,949,098 A | * | 9/1999 | Mori | 257/211 |
| 6,504,252 B2 | * | 1/2003 | Matsunaga | 257/758 |

* cited by examiner

*Primary Examiner*—Hung Vu
(74) *Attorney, Agent, or Firm*—Beyer Weaver & Thomas, LLP

(57) ABSTRACT

To significantly reduce parasitic capacitance of component's landing pad, the present invention forms patterned holes in reference potential layers below the pad, thus effectively increasing the dielectric distance between the pad and the reference potential planes below the pad, raising the characteristic impedance of the pad above that of the trace connected to the pad. A controlled amount of parasitic capacitance is re-introduced to the pad by forming at least one grounded metal plate adjacent to the pad, bringing the characteristic impedance of the pad to substantially match that of the trace. The distance of the metal plates from the pad, and the configuration of the patterned holes are predetermined to substantially match the pad's impedance with that of the trace.

13 Claims, 5 Drawing Sheets

SUBSTRATE PADS WITH REDUCED IMPEDANCE MISMATCH AND METHODS TO FABRICATE SUBSTRATE PADS

FIELD OF THE INVENTION

The present invention relates generally to the design and fabrication of printed circuits and multi-layered substrates that are suitable for carrying signals with very high data rates. More particularly, the invention relates to techniques to reduce landing pad parasitic components and reduce the impedance discontinuity between the pad and the interconnect to the pad.

BACKGROUND OF THE INVENTION

Printed circuit boards (PCB) are used to couple signals among components that are mounted on the board. Components mounted on a board are typically electrically connected to the board through landing pads formed on the surface of the board, and are electrically coupled to other components through conductive interconnect elements.

As known in the art, multi-layered printed circuit boards are usually formed by the lamination of alternating layers of thin metal sheets and rigid dielectric materials. The metal layers are patterned to create conductive interconnecting elements in the form of microstrips running on the surface of the board, or striplines running in the interior layers of the board. Some of the metal layers are typically designed to serve as reference potentials, such as ground and components' supply voltages. These layers, which are often called reference potential planes, are typically interspersed between alternating signal layers. The dielectric provides structural integrity to the PCB and electrical isolation between the metal layers.

The data rates of the signals propagating through printed circuit boards are ever increasing. The increasing signal speed requires improvements in the signal fidelity as well as the interconnect's bandwidth when a signal propagates between two nodes in the printed circuit board. As known in the art, the interconnecting conductor, the adjacent reference potential planes, and dielectric layer are generally designed to form a transmission line having a pre-determined impedance, which is typically 50 ohms. In most applications, the widths of the landing pads are significantly larger than the widths of their associated interconnect conductors. Thus, the impedance of the landing pads is generally significantly lower than that of their associated interconnect conductors. This is due to the fact that the dielectric separation from the adjacent reference potential plane is the same for both the landing pads and the interconnect conductor, and impedance changes inversely to width. The lower impedance of the landing pads introduces excess parasitics that limit the bandwidth of the interconnecting conductor, and the impedance mismatch between the pad and the interconnecting conductor results in transmission problems in high-speed applications. One example is the use of a ball-grid-array (BGA) package in a multi-gigahertz printed circuit board. The landing pads of current state of the art BGAs are typically 25–30 mils in diameter, which is significantly larger than the typically 5 mil microstrips used in interconnecting conductors. Another example is a substrate used inside a BGA package. Typical solder ball landing pad sizes for current technology BGA substrates are on the order of 20–25 mil, significantly larger than the typically 3 mil traces used in microstrip interconnects.

The relatively large landing pad geometry creates an impedance mismatch, resulting in signal fidelity degradation caused by the superimposition of reflected energy from impedance discontinuity. The substantial impedance drop of the pad causes excess parasitic capacitance, which results in a reduction in bandwidth and slowing the signal transition rate.

One technique used to compensate the impedance mismatch is to reduce the width of a small section of the interconnecting conductor at the vicinity of the pad, with the goal being to keep an average impedance. However, signal reflections which could limit the performance of an interconnect are often caused by impedance discontinuities, especially for very high-speed signals.

Another technique believed to be used by some engineers in addressing the impedance mismatch problem is to remove some metal in the reference plane directly underneath the pad. However, the hole in the reference potential plane is typically larger than the pad, which potentially introduces an impedance discontinuity near the junction of the pad and the interconnect conductor.

In view of the foregoing, there are continuing efforts to decrease the parasitic capacitance of substrate landing pads and to provide better impedance matching between the traces and the landing pads.

SUMMARY OF THE INVENTION

In some embodiments, a printed circuit board is provided having a landing pad on the surface, coupled to a trace. A reference potential plane is disposed in the interior region running parallel to the surface. The plane is located above or below the trace, separated by a dielectric layer at a certain distance. The pad is configured to provide an impedance to the transmission line that is substantially matched to the impedance of the trace thereby substantially avoiding impedance discontinuity between the pad and the trace.

In some other embodiment, a printed circuit board is provided with a landing pad on the surface, coupled to an interconnecting trace. A reference potential plane is disposed in the interior region running parallel to the surface. The plane is located above or below the trace, separated by a dielectric layer at a known distance. The reference potential plane has an opening directly under or above the pad and is larger than the pad, thus raising the impedance of pad above that of the trace. The length of the pad is extended such that the junction between the pad and the trace is located directly above or below the boundary of the opening. At least one strip connected to a nearby reference potential, is patterned adjacent to the pad, and separated by a predetermined distance to the pad. The metal strips re-introduce enough parasitic capacitance to lower the pad's impedance to substantially match the impedance of the trace.

In other embodiments, a printed circuit board is provided with a landing pad on the surface, coupled to an interconnecting trace with pre-determined impedance. A plurality of reference potential planes are disposed in the interior region running parallel to the surface. The planes are located above or below the trace, separated by dielectric layers at known distances. The reference potential planes each has an opening directly under or above the pad and larger than the pad, raising the impedance of pad above that of the trace. The length of the pad is extended such that the junction between the pad and the trace is located directly above or below the boundary of the opening. At least one metal strip connected to a nearby reference potential is patterned adjacent to the pad, separated by a pre-determined distance to the pad. The metal strip(s) re-introduce enough parasitic capacitance to lower the pad's impedance to substantially match the impedance of the trace.

In yet other embodiments, a printed circuit board is provided with a landing pad on the surface, coupled to an interconnecting trace. A plurality of reference potential planes are disposed in the interior region running parallel to the surface. The planes are located above or below the trace, separated by dielectric layers at known distances. A consecutive number of the reference potential planes each having an opening directly under or above the pad and larger than the pad, raise the impedance of pad above that of the trace. The length of the pad is extended such that the junction between the pad and the trace is located directly above or below the boundary of the opening. At least one metal strip connected to a nearby reference potential, is patterned adjacent to the pad, and separated by a pre-determined distance to the pad. The metal strips re-introduce just enough parasitic capacitance to lower the pad's impedance to match the impedance of the trace.

These and other aspects, advantages, and objects of the present invention will become more apparent and be more readily understood from the following detailed description, which should be read in conjunction with the accompanying drawings.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE EMBODIMENTS

A landing pad's parasitic capacitance may be reduced by forming patterned holes in one or more reference potential layers below the landing pad. Reducing the landing pad's parasitic capacitance creates a corresponding increase in the landing pad's impedance. In some of the described embodiments the size of the patterned hole(s) are determined such that the impedance of the pad is substantially above that of the trace. This "oversizing" of the hole(s), results in a reduction in the dependency on the fringing capacitance that is subject to large variation from physical dimension variations in the fabrication process. A pre-determined amount of capacitance is then re-introduced to the landing pad in a controlled fashion. This is achieved by positioning one or more metal strips adjacent the landing pad, thus forming compensation capacitor plates to the landing pad. The metal strips are connected to a nearby reference potential. The distance between the compensation capacitor plates and the pad is determined to re-introduce just enough landing pad parasitic capacitance to lower the pad's characteristic impedance to match that of the trace. The length of the pad may also be extended along with the compensation capacitor plates to the boundary of the patterned hole. This ensures there is no disruption in the reference potential plane to the trace and there is no impedance discontinuity between the pad and the trace.

Figure 1:
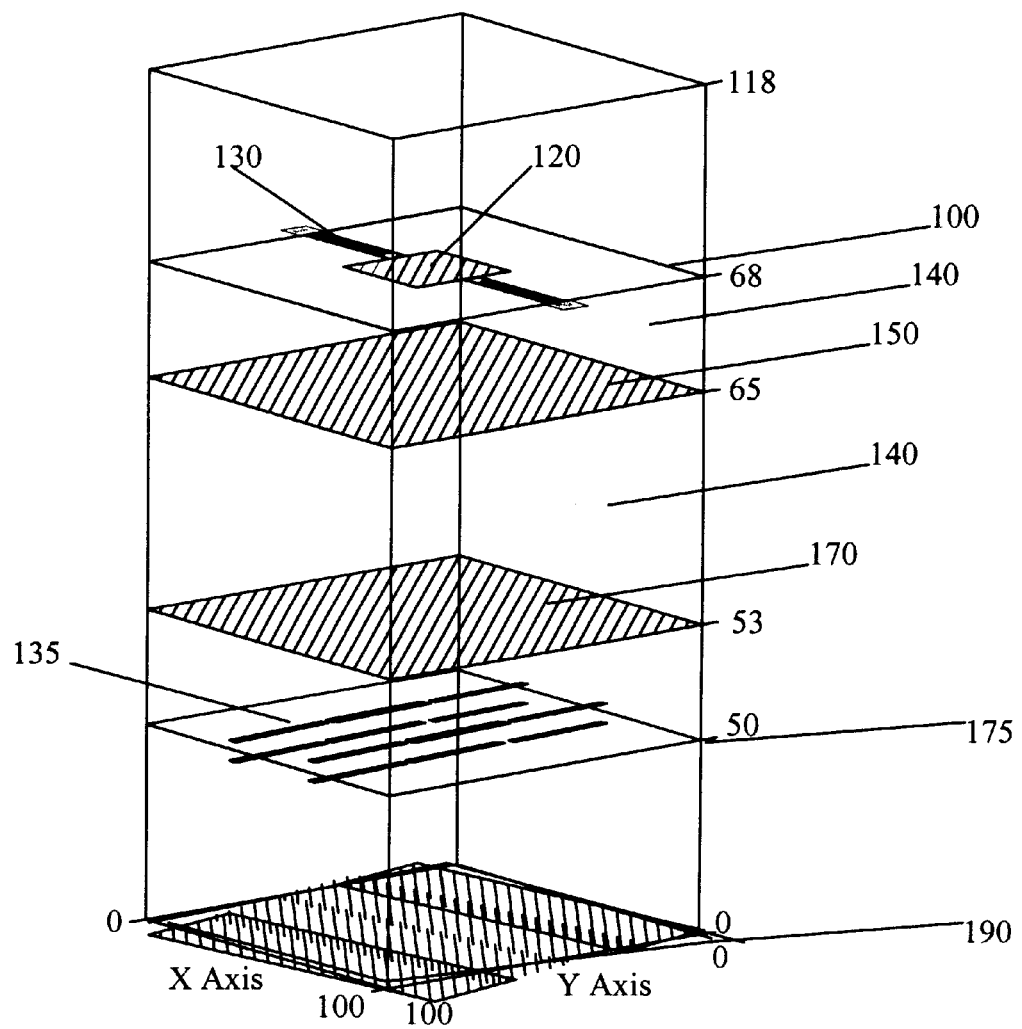
FIG. 1 is an exploded isometric drawing of a known printed circuit board.
Figure 2A:
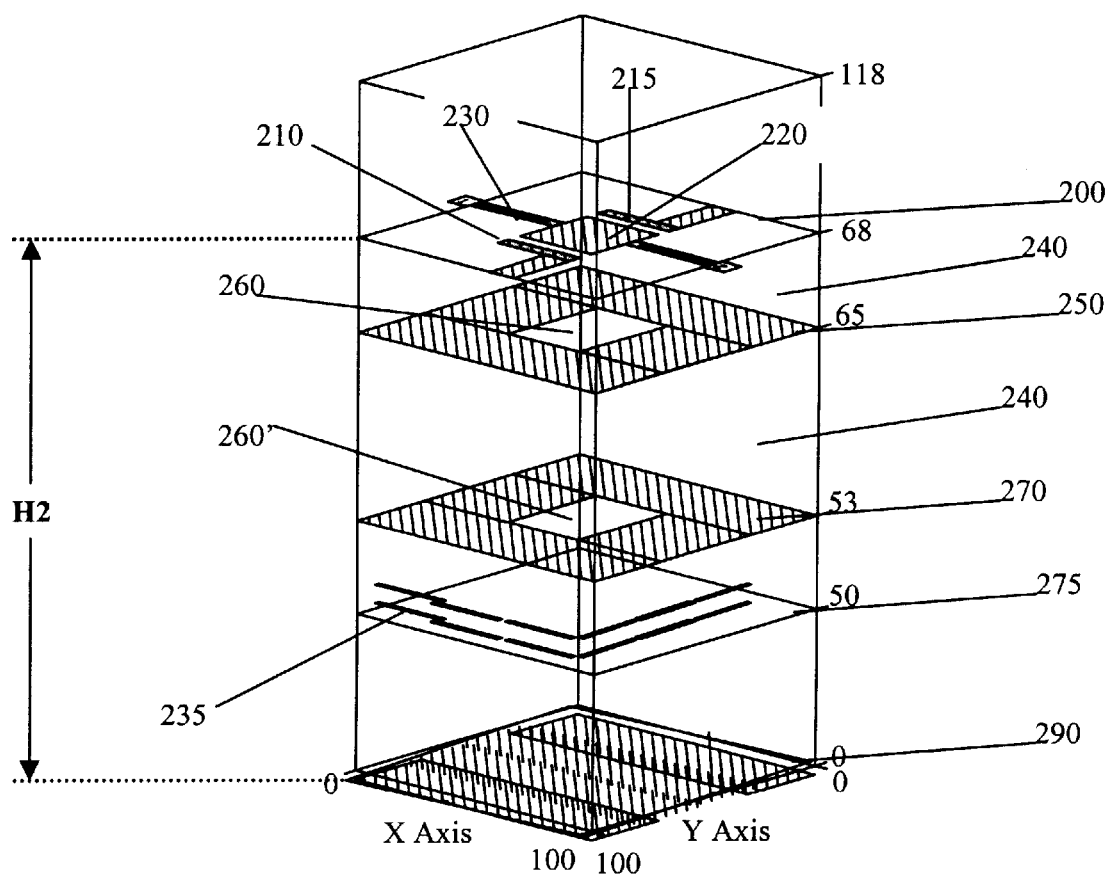
FIG. 2a depicts a PCB according to the first embodiment of the present invention.

FIG. 2a is an exploded isometric drawing of a segment of a PCB that for illustrative purposes, includes a single trace 230 and pad 220 compensated according to a first embodiment of the present invention. Metal layers in the PCB are used to mount components, route traces, and distribute power. All metal layers are separated by a dielectric material 240. Layer 200 is the surface metal layer where a component lead is electrically bonded to pad 220 and interconnected with other components by trace 230. Layer 250 is the first metal power plane layer below surface metal layer 200 that has patterned hole 260. Patterned hole 260 is formed by any suitable technique that creates a prescribed region devoid of metal. Known methods include chemical etching or mechanical removal. Layer 270 represents an intermediate metal power plane layer with patterned hole 260', or 260", that is below the top two metal layers. The number of power plane layers with patterned holes depends on the pad size and the amount of parasitic capacitance to be removed. Metal layer 275 represents any intermediate routing layer with traces 235. There is no fundamental limit to how many alternating metal and dielectric layers can be stacked.

Capacitance is re-introduce in a controlled manner by adding compensation capacitors 210 and 215, which take the form of metal strips. The compensation capacitors may be connected to a nearby reference potential (not shown in FIG. 2a) on the surface metal layer 200 or possibly to a nearby reference plane through a via. In the embodiment shown, the compensation capacitors 210 and 215 are positioned on opposite sides of the landing pad at a pre-determined distance from the pad. Of course, the number of compensation caps provided, as well as their relative sizing and spacing from the landing pad may be varied to meet the needs of a particular application.

The compensation capacitors are designed to re-introduce to the landing pad enough parasitic capacitance to substantially match the trace's characteristic impedance. The length of the pad 220, along with metal strips 210 and 215 are preferably extended to the boundary of the patterned hole. This ensures impedance continuity between the pad and the trace. By way of example, an impedance matching of better than 10% is readily achievable.

FIG. 2a shows ground reference layer 290 as the lowermost metal layer below which the planes are solid metal planes. As the parasitic capacitance is inversely proportional to the effective distance between the pad and the reference plane, the solid metal plane at layer 290 has little contribution, while the metal capacitance plates 210 and 215 at close proximity to the pad have the most contribution, and the fringing capacitance between the pad and the pattern holes introduces a secondary contribution to the pad's impedance.

FIG. 2a shows a square pad and square patterned holes. It should be appreciated that there is no limitation to the shape of the pad. For example, round pads are commonly used in BGA applications. In such embodiments, the patterned holes may be implemented as concentric patterned round holes in the reference planes.

Figure 2B:
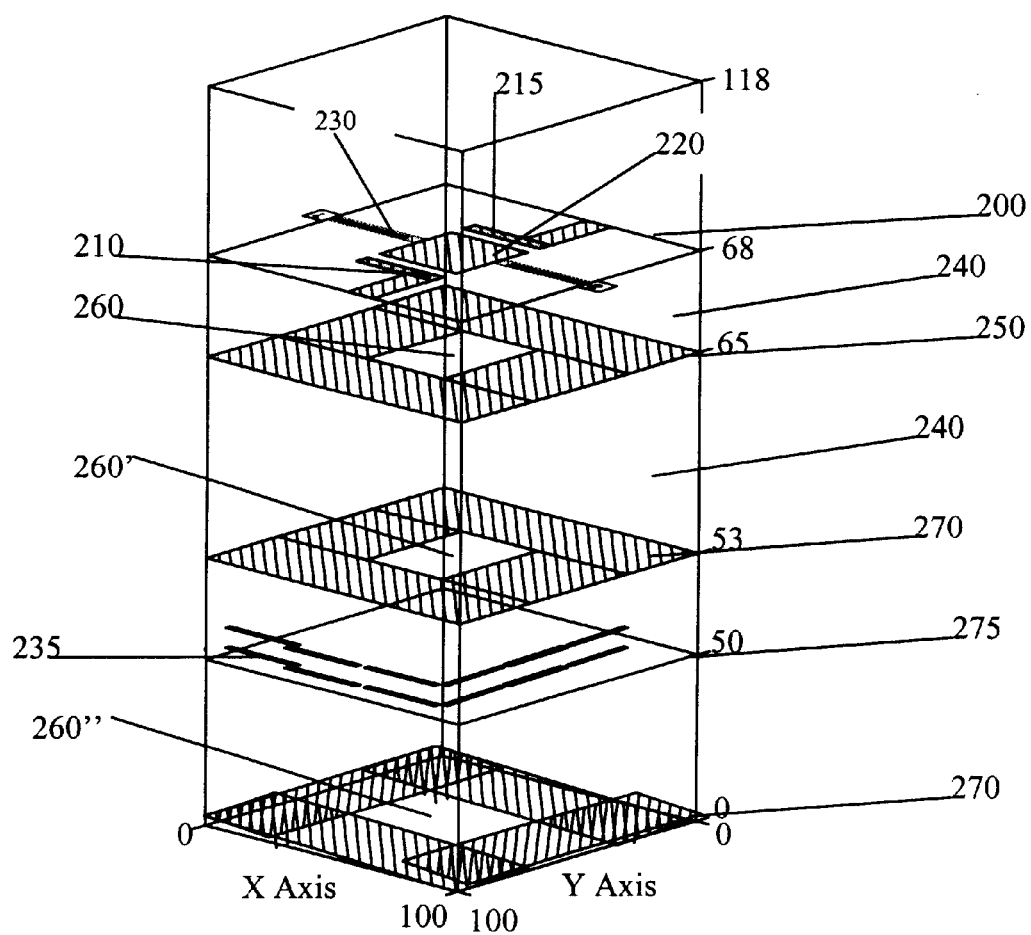
FIG. 2b depicts a PCB according to the second embodiment of the present invention.

There are other cases where more parasitic capacitance reduction is required. FIG. 2b illustrates a second embodiment of the present invention, where no ground reference layer 290 is present, and all power planes have patterned holes formed under pad 220.

Any conductive traces 235 in metal routing layers such as layer 275, should be routed around where patterned hole 260's projection onto that layer would be, as shown in FIGS. 2a and 2b. Were traces 235 to be routed through this area, they would tend to introduce unwanted coupling capacitance between pad 220 and traces 235.

Figure 3A:
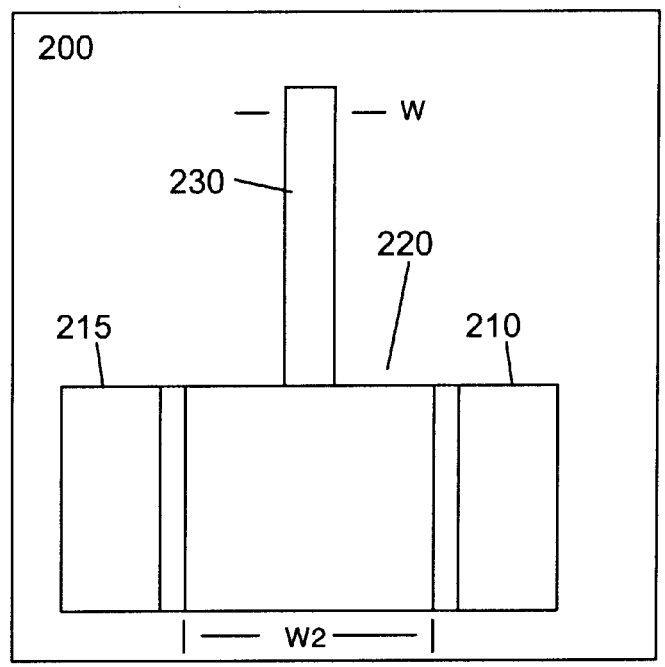
FIG. 3a is a diagrammatic top level view of a third embodiment of the present invention.
Figure 3B:
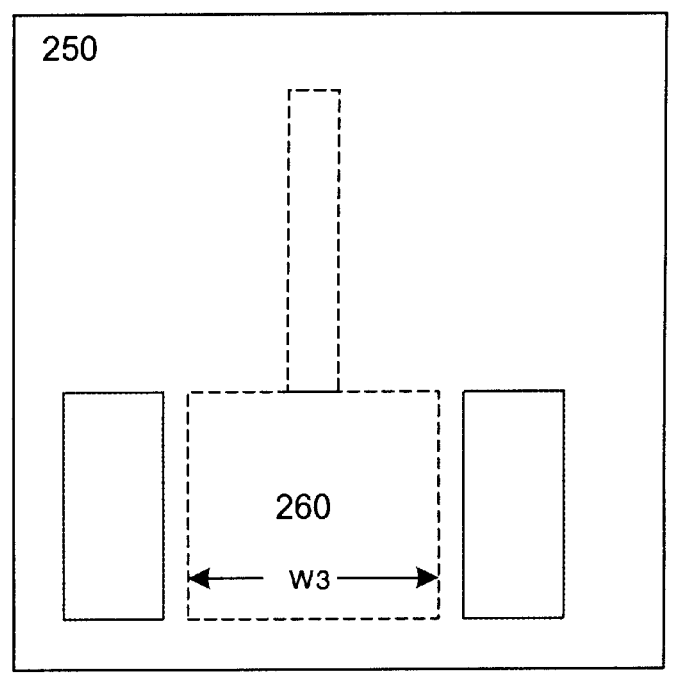
FIG. 3b illustrates the second metal layer of the third embodiment.
Figure 3C:
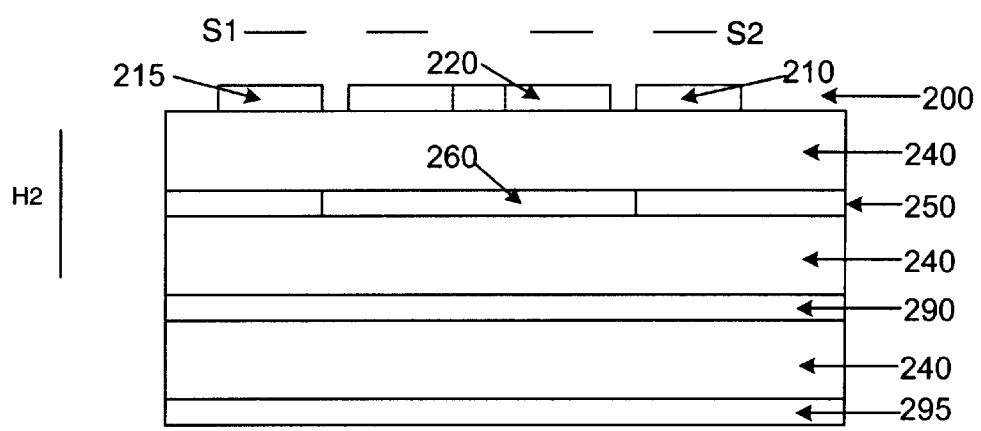
FIG. 3c is a cross-sectional view of the completed PCB.

FIG. 3a illustrates a top view of the third embodiment of the present invention. FIG. 3b shows the second conductive layer of the third embodiment, and FIG. 3c is a vertical cross-section of the completed PCB of the third embodiment. The third embodiment is a configuration that prescribes that at least first power plane 250 below pad 220 must be patterned with hole 260. Referring to FIGS. 3a, b, and c, with a common ground reference, the difference in impedance between pad 220 and trace 230 is related to the pad-to-trace ratio W2/W. It should further be appreciated that any layers below the ground reference, such as metal layer 295, do not have a parasitic capacitance effect on the trace or landing pad, due to shielding by the ground reference layer 290 that blocks electromagnetic field. In this embodiment of the present invention, to match the impedance of pad 220 to trace 230, the variables to adjust are W3, H2, S1, and S2. H2 is the distance between surface metal layer 200 and ground reference layer 290. W3 is the patterned hole size. H2 and W3 are determined with the goal to raise the pad's impedance above that of the trace. S1 and S2 are the respective distances from plates 215 and 210 to pad 220. S1 and S2 are determined to match the pad's impedance to that of the trace. The compensation capacitor plate length is equal to the full length of pad 220, which is set to the same length of the patterned hole. The dimensions W3, H2, S1 and S2 are best chosen with the help of an electromagnetic field solver simulation tool.

Having described embodiments of the present invention, some other attendant advantages are best understood by way of experimental results. A prototype board was constructed with a component having a surface mounted SMA connector with a 70-mil round landing pad connected to a 10-mil wide, 50-ohm microstrip, the microstrip being designed with a 6-mil dielectric separation between the microstrip and its reference plane. In this configuration, the impedance of the 70-mil landing pad drops to 36 ohm.

The landing pad was modified according to the third embodiment of the present invention, with S1=S2=20 mil, W3=110 mil, and H2=52 mil. The 70-mil wide pad had an impedance of 46.4 ohms. This improvement in impedance mismatch and removal of excess capacitance enhanced the bandwidth of the interconnect from 3.8 GHz to 7.2 GHz.

Having fully described several embodiments and applications of the present invention, other equivalent or alternative methods of implementing printed circuit pad compensation according to the present invention will be apparent to those skilled in the art. The invention has been described above by way of illustration, and the specific embodiments disclosed are not intended to limit the invention to the particular forms disclosed. For example, although in the previous embodiments landing pads were shown to be on the top surface of the PCB, they can equivalently be formed on the bottom PCB surface. The particular implementation of the printed circuit may, also, vary depending upon the particular type of substrate used. The substrates described herein were laminated PCB implementations. However, similar layered printed circuit routing techniques are used in the semiconductor industry. Semiconductor applications would use different dielectrics (e.g., SiO2), and patterning methods (e.g., deposition), yet semiconductor implementations of the present invention are contemplated as within the scope of the present invention. The invention is thus to cover all modifications, equivalents, and alternatives falling within the spirit and scope of the following claims.

We claim:

1. A circuit interconnection system comprising:

alternating patterned conductive layers and dielectric layers;

wherein the conductive layers include patterned pads, interconnecting traces, and conductive areas, wherein at least a first one of said conductive areas above or below at least a selected one of the pads has a patterned hole that is vertically aligned with the selected pad and separated from the selected pad by one of said dielectric layers; and wherein the conductive layer including the selected pad has at least one capacitor structure formed by a first capacitor plate located proximate to that pad.

2. The circuit interconnection system of claim 1 wherein the conductive area surrounding the patterned hole is set to a constant voltage potential.

3. The circuit interconnection system of claim 1 wherein two of said conductive areas each have a patterned hole that is vertically aligned with one of said patterned pads.

4. The circuit interconnection system of claim 1 wherein the area of said patterned hole is larger than the area of said selected pad.

5. A multi-layered circuit board comprising alternating patterned conductive layers and dielectric layers, wherein:

a first one of the conductive layers is an exposed surface layer having a plurality of contact pads thereon, said contact pads being suitable for electrical connection to components mounted on the circuit board;

a second one of the conductive layers has a first plurality of patterned holes therein that are associated with corresponding ones of the contact pads, each said patterned hole being aligned with its associated contact pad so as to reduce the parasitic capacitance of its associated contact pads; and wherein said surface layer includes a plurality of compensation capacitors, each compensation capacitor being associated with an associated contact pad and being configured to increase said parasitic capacitance of its associated contact pad.

6. The multi-layered circuit board of claim 5 wherein:

the first one of the conductive layers further includes interconnect lines associated with corresponding ones of the contact pads, said interconnected lines configured to transmit electrical signals to and/or from said associated contact pads; and the second one of the conductive layers is a first reference potential plane.

7. The multi-layered circuit board of claim 6 wherein the first reference potential plane is selected from the group consisting of a power plane and a ground plane.

8. The multi-layered circuit board of claim 6 wherein a third one of the conductive layers is a second reference potential plane, the third one of the conductive layers having a second plurality of patterned holes therein that are aligned with associated ones of the contact pads, the second plurality of patterned holes being configured to reduce the parasitic capacitance of said associated contact pads.

9. The multi-layered circuit board of claim 8 wherein every reference potential plane in the multi-layered circuit board has a patterned hole that is aligned with an associated contact pad.

10. The multi-layered circuit board of claim 5 wherein said compensation capacitors includes first capacitor plates formed in the first one of the conductive layers and separate from their associated contact pads.

11. The multi-layered circuit board of claim 10 wherein said compensation capacitors further include second capacitor plates formed in the first one of the conductive layers and separate from said associated contact pads.

12. The multi-layered circuit board of claim 5 wherein the area of at least one said patterned hole is larger than the area of said associated contact pad.

13. The multi-layered circuit board of claim 5 further comprising a plurality of traces extending from said plurality of contact pads, wherein said compensation capacitors increase said parasitic capacitance so as to substantially match the characteristic impedances of said contact pads to the characteristic impedances of said traces.

* * * * *